(12) United States Patent
Geer et al.

(10) Patent No.: US 8,916,910 B2
(45) Date of Patent: Dec. 23, 2014

(54) RECONFIGURABLE RF/DIGITAL HYBRID 3D INTERCONNECT

(75) Inventors: Robert E. Geer, Niskayuna, NY (US); Wei Wang, Niskayuna, NY (US); Tong Jing, Guilderland Center, NY (US)

(73) Assignee: Research Foundation of State University of New York, Albany, NY (US)

( * ) Notice: Subject to any disclaimer, the term of this patent is extended or adjusted under 35 U.S.C. 154(b) by 209 days.

(21) Appl. No.: 12/966,128

(22) Filed: Dec. 13, 2010

(65) Prior Publication Data
US 2012/0146099 A1 Jun. 14, 2012

(51) Int. Cl.
*H01L 23/52* (2006.01)
*H01L 23/48* (2006.01)

(52) U.S. Cl.
CPC ....... *H01L 23/481* (2013.01); *H01L 2924/0002* (2013.01)
USPC .................................. 257/209; 257/E23.141

(58) Field of Classification Search
USPC .................................. 257/209, 208, E23.141
See application file for complete search history.

(56) References Cited

U.S. PATENT DOCUMENTS

| | | | | |
|---|---|---|---|---|
| 7,312,109 B2 * | 12/2007 | Madurawe | ..................... | 438/138 |
| 7,330,368 B2 * | 2/2008 | Saito et al. | ..................... | 365/63 |
| 7,701,252 B1 * | 4/2010 | Chow et al. | ..................... | 326/41 |
| 7,830,692 B2 * | 11/2010 | Chung et al. | ..................... | 365/51 |
| 7,969,193 B1 * | 6/2011 | Wu et al. | ..................... | 326/82 |
| 8,058,897 B1 * | 11/2011 | Lu et al. | ..................... | 326/38 |
| 8,273,610 B2 * | 9/2012 | Or-Bach et al. | ..................... | 438/142 |
| 2004/0214387 A1 * | 10/2004 | Madurawe | ..................... | 438/200 |
| 2009/0039492 A1 * | 2/2009 | Kang et al. | ..................... | 257/686 |
| 2009/0070721 A1 * | 3/2009 | Solomon | ..................... | 716/8 |
| 2010/0060310 A1 * | 3/2010 | Laisne et al. | ..................... | 326/10 |
| 2010/0295136 A1 * | 11/2010 | Or-Bach et al. | ..................... | 257/390 |
| 2011/0074464 A1 * | 3/2011 | Gunaratna et al. | ..................... | 326/41 |
| 2011/0090004 A1 * | 4/2011 | Schuetz | ..................... | 327/564 |
| 2011/0204917 A1 * | 8/2011 | O'Neill | ..................... | 326/38 |
| 2011/0291289 A1 * | 12/2011 | Yoon et al. | ..................... | 257/774 |
| 2011/0309519 A1 * | 12/2011 | Kim | ..................... | 257/774 |

OTHER PUBLICATIONS

L. Yu, et al., "Electrical Characterization of RF TSV for 3D Multi-Core and Heterogeneous ICs," IEEE/ACM International Conference on Computer-Aided Design (ICCAD), 2010, pp. 686-693.

* cited by examiner

*Primary Examiner* — William F Kraig
*Assistant Examiner* — Latanya N Crawford
(74) *Attorney, Agent, or Firm* — Saliwanchik, Lloyd & Eisenschenk, P.A.

(57) ABSTRACT

Reconfigurable 3D interconnect is provided that can be used for digital and RF signals. The reconfigurable 3D interconnect can include an array of vertical interconnect vias (or TSVs) providing a signal path between a first core element of a 3D IC and a second core element of the 3D IC stacked above the first core element. A routing circuit can be used to route a signal from the first core element to the second core element through selected TSVs of the array of TSVs providing the signal path between the first core element and the second core element. The routing circuit allows re-routing of the signal through different selected TSVs during operation, which can provide real time adjustments and capacity optimization of the TSVs passing the particular signal between the elements.

19 Claims, 13 Drawing Sheets

RECONFIGURABLE RF/DIGITAL HYBRID 3D INTERCONNECT

This invention was made with government support under Contract No. HR0011-07-3-0002 awarded by DARPA. The U.S. Government has rights in this invention.

BACKGROUND OF THE INVENTION

As the semiconductor industry moves into nanometer technologies, interconnect latency is increasing and substantial design constraints are occurring for the shrinking wires. Conversely, gate delay times are decreasing, enabling exponentially increased computing power. Because of the interconnect latency and corresponding design constraints, the input/output interconnect rate is not able to keep up with computing power capabilities of a particular technology node.

In addition, the available energy for the system is decreasing for off-chip and on-chip interconnect systems. Accordingly, multiple lower-performance cores arranged in parallel are replacing the single high-performance core. This arrangement is referred to as the many-core architecture. By utilizing the many-core architecture, the latency budget is increased for the intra-core interconnects and the wiring length distributions are significantly modified. Accordingly, numerous processors are scaling to the many-core system.

Indeed, the number of processing cores comprising a MPU (microprocessor unit) or ASIC (application specific integrated circuit) is rapidly increasing. Some recent examples include the IBM Cell 9-core chip (an IBM 64-bit Power Architecture™ core with eight specialized co-processors), the NVIDIA GT200 30-core chip (three streaming multiprocessors (SMs) each having eight streaming processors (SPs) and two special function units (SFUs)), the Tilera TILE64 64-core prototype chip, and the Intel TeraFlops 80-core research chip. This trend has been driven by the performance limitations associated with single-core MPUs due to device operating frequency and MPU die size. The rapid expansion of processing cores has also spurred the implementation of network-on-chip (NoC) architectures.

In addition, the overall increase of devices on a chip has dramatically increased the demands on intra-core and inter-core interconnect performance. In particular, demands for reduction in interconnect signal latency, reduction in energy/bit, increased bandwidth (BW)/link, and increased bisection BW (biBW) are dramatically increasing.

By way of example, the Tilera TILE64 64-core prototype chip utilizes 32 Tbps of on-chip interconnect BW and 2 Tbps of biBW. The Intel TeraFlops research chip (80 cores) requires a biBW of about 1 Tbps with BW/link of hundreds of Gbps. The interconnect demands for such systems will significantly increase as three-dimensional integrated circuits (3D ICs) rapidly expand the number of cores and transistors within an MPU, ASIC, or mixed-signal system. A 3D IC is a single integrated circuit built by stacking silicon wafers and/or dies and interconnecting them vertically so that they behave as a single device. The move to 3D ICs aims to achieve smaller footprints for devices and reduce distances that a signal must travel to get to particular circuits on the chip. FIGS. 1A and 1B illustrate the two-dimensional (2D) NoC and 3D IC NoC arrangement, respectively. Referring to FIGS. 1A and 1B, it can be seen that as the NoC is implemented in 3D, multiple tiers of processing elements (PEs) and various higher cache levels (L2, L3, and L4) move vertical. Therefore, each node switching element is integrated with horizontal and vertical links. The vertical links are provided by through silicon vias (TSVs).

Many-core 3D ICs designed for different applications place various demands on vertical BWs. For example, as shown in FIG. 2, the average vertical memory access BW for a stacked memory-on-logic 3D IC is estimated at 2 Tbps based on the 2D planar multi-core processor. In contrast, the average vertical BW for computation applications, at 5 Tbps, is nearly three times that for average memory access BW. Moreover, assuming that 3D ICs for multimedia applications conform to conventional digital video frame rates of 25-30 frames/s, the average vertical BW would exceed 100 Tbps.

Furthermore, different NoC topologies for many-core 3D ICs have different in-plane and vertical BW requirements. Expansion from a 2D many-core IC to a 3D many-core IC as illustrated by FIGS. 1A and 1B will increase the biBW for the same number of cores. Furthermore, the biBW will also increase dramatically if the application requires an increase in the number of links for each NoC node or core. This is shown schematically in FIG. 3 and provided in Table 1, where n is the number of nodes (or cores).

TABLE 1

| 2D Mesh Nodes | 2D biBW n (Tbps) | 3D biBW $n^2/2$ (Tbps) | Enhanced One more link BW $n^2$ (Tbps) | Max Enhanced BW $n^4/4$ (Tbps) |
| --- | --- | --- | --- | --- |
| 8 × 8 | 2 | 8 | 16 | 128 |
| 10 × 10 | 2.5 | 12.5 | 25 | 312.5 |
| 12 × 12 | 3 | 18 | 36 | 648 |

The increases required for biBW going from 2D to 3D are shown in Table 1 for three different 2D n×n meshes. Also shown in Table 1 are the increases required for biBW when additional vertical links are required per node (referred to as 3D enhanced). The increase in biBW for 2D, 3D, and 3D-enhanced systems as a function of the number of cores is shown in FIG. 4. From the plot in FIG. 4, it is clear that the biBW increases rapidly both as a function of cores and, especially, as a function of NoC topology (i.e. links/node).

Accordingly, the vertical bandwidth required for TSVs in a 3D IC is a strong function of the link topology and the chip architecture. Therefore, the range of average vertical BW supported by TSV-based interconnects in a 3D IC must be revised to reflect this. This is illustrated in FIG. 5. For the simplest stacked 2D NoC mesh (3D biBW), the average vertical BW requirement ranges from 8-18 Tbps. If a NoC topology is required that introduces only a single additional link/node ("Enhanced one more link"), the average vertical BW requirement doubles to 16-36 Tbps. If a maximal NoC link topology is used (($n^2/2$)−1 links per core "Max enhanced") the vertical BW requirement jumps to 128-648 Tbps.

Conventional implementation of TSVs is insufficient to meet this vertical BW need at an acceptable energy per bit. As an example, for a given 3D IC footprint, each TSV has roughly the same geometry (e.g., size, aspect ratio) due to processing constraints, and each TSV (or TSV-array) has the same frequency response for signal transmission. The number of TSVs per unit area on the 3D IC is fixed at roughly 10% of the die area. In addition, only a fraction of TSVs are available for communications (~10-20%). However, real-time vertical communication BW in many-core 3D ICs, particularly for the case of NoC architectures, changes according to workload. Thus, to satisfy peak BW demand, excess TSV capacity is maintained, which will exceed TSV area allowances. Consequently, a many-core 3D IC based on TSVs with the same signal transmission speed cannot simultaneously satisfy the high BW requirements and area constraints described above.

For example, a 1S4G TSV structure may be used to meet the average BW requirements of a given 3D IC. In particular, the 1S4G is a 5-TSV link (1 signal TSV and 4 ground TSVs) that enables a data rate (BW) of 8 Gbps. When the TSV structure is fabricated with a 5 μm diameter for each TSV and a 10 μm distance from the centers of adjacent TSVs, an area requirement of the 1S4G is 200-300 $\mu m^2$/TSV. The 1S4G TSV link is used because it tends to be superior to isolated signal TSVs (referred to as 1S TSVs), which have data rates ~1 Gbps and area requirements of 100 $\mu m^2$/TSV.

For a given 3D IC, 12500 1S4G TSVs are needed to achieve an average vertical BW of 100 Tbps compared to 100,000 1S TSVs. 625 1S4G TSVs are needed to achieve an average vertical BW of 5 Tbps compared to 5000 1S TSVs. And, 250 1S4G TSVs are needed to achieve an average vertical BW of 2 Tbps compared to 2000 1S TSVs. For each scenario the 1S4G approach requires only 38% of the area that would be utilized for the 1S approach.

Presently, existing 3D ICs have die areas between 1 $mm^2$ and 20 $mm^2$. Considering a case where the total in-plane die area is 20 $mm^2$, the 1S4G TSV links can satisfy estimated vertical BW requirements based on a simple 3D biBW model (8-18 Tbps). In particular, given that the number of TSVs per unit area on the 3D IC is fixed at roughly 10% of the die area and only about 10% of the TSVs are available for communications, 1000 1S4G TSV links can be used to satisfy the vertical BW requirements (20 $mm^2 \times 10\% \times (10\%/200 \mu m^2)$ =1000) by providing 8 Tbps.

However, for the case of the 3D-enhanced NoC topology (16-36 Tbps), the 1S4G TSV links, while capable of satisfying the data rate requirements, violate the area constraints. Moreover, for the max-enhanced NoC topology (128-648 Tbps), the 1S4G TSV links cannot satisfy either the data rate or area requirements.

Accordingly, there exists a need in the art for appropriate interconnect structures that can satisfy vertical link performance, power, and area requirements.

BRIEF SUMMARY

Embodiments of the invention provide dynamically reconfigurable interconnects that can be used for addressing the variable bandwidth needs of 3D ICs.

According to one embodiment, a reconfigurable 3D interconnect is provided that includes an array of vertical interconnect vias providing a signal path between a first core element of a 3D IC and a second core element of the 3D IC stacked above the first core element; and a routing circuit selectively routing a signal from the first core element to the second core element through the array of vertical interconnect vias to provide a particular signal path between the first core element and the second core element.

The routing circuit can be configured to cause selected particular vertical interconnect vias of the array of vertical interconnect vias to connect to the first core element and the second core element such that the signal passes from the first core element to the second core element through the selected particular vertical interconnect vias. The routing circuit can also cause certain vertical interconnect vias to be grounded and/or connected to additional circuitry before and/or after passing the signal.

The selecting and connecting by the routing circuit can be performed in real time on an as-needed basis by switching on and off pass transistors connected to the vertical interconnect vias.

The vertical interconnect vias can be TSVs of simple conductive vias and coaxial via structures. In addition, the TSVs can be configured with support circuitry, such as buffers and transceivers, enabling a variety of TSV structures such as 1S TSV, 1S4G TSV, and differential TSV structures.

In accordance with certain embodiments of the invention, multiple conventional TSV interconnect approaches can be combined on a same chip and configured for use on an as-needed basis.

Certain embodiments of the invention can be fabricated using standard TSV processes, and are therefore adoptable for implementation in many-core 3D ICs utilizing network-on-a-chip (NoC) architectures.

According to one aspect of the invention, RF and digital signals can be sent over the same TSVs by utilizing the subject dynamically reconfigurable TSV schemes. The particular TSV structure that the signal passes through can be optimized for the particular signal being passed. The optimizing can manage the power/performance trade-offs associated with conventional TSV-based circuit designs.

Moreover, since embodiments of the subject reconfigurable TSV schemes are intrinsically and dynamically reconfigurable, the subject schemes can be used to optimize 3D IC performance for a range of application and performance needs.

BRIEF DESCRIPTION OF THE DRAWINGS

FIG. 6A shows a plan view of a 1S TSV; FIG. 6B shows a plan view of a 1S2G TSV; FIG. 6C shows a plan view of a 1S4G TSV; FIG. 6D shows a plan view of a 1S8G TSV; FIG. 6E shows a schematic representation of a differential (Diff) TSV; and FIG. 6F shows a perspective view of a coaxial TSV.

FIG. 11A shows bandwidth versus area and FIG. 11B shows bandwidth versus power for the TSV structures.

FIG. 14A shows a side-sectional view and FIG. 14B shows a schematic diagram.

DETAILED DISCLOSURE

Embodiments of the present invention provide reconfigurable vertical interconnect via schemes. The vertical interconnect vias can be TSVs for 3D ICs. In accordance with certain embodiments of the present invention, a reconfigurable TSV technology is provided that can be used to optimize the interconnect performance of a 3D IC in terms of interconnect power, BW, and TSV area requirements.

Advantageously, embodiments of the subject reconfigurable TSV schemes can be implemented using a variety of TSV structures using the same wires.

Figure 6A:
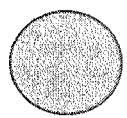
FIGS. 6A to 6F illustrate example TSV structures that can be used in certain embodiments of the present invention.
Figure 6B:
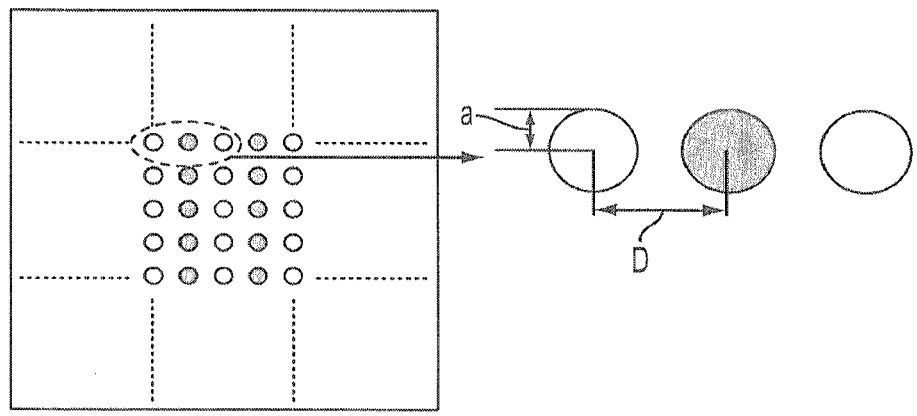
Figure 6C:
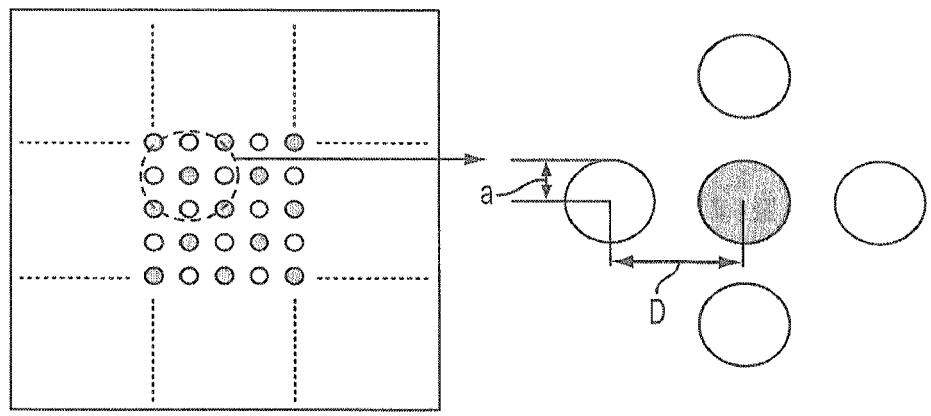
Figure 6D:
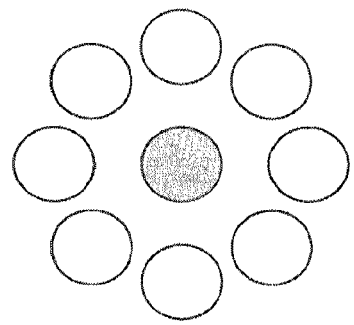
Figure 6E:
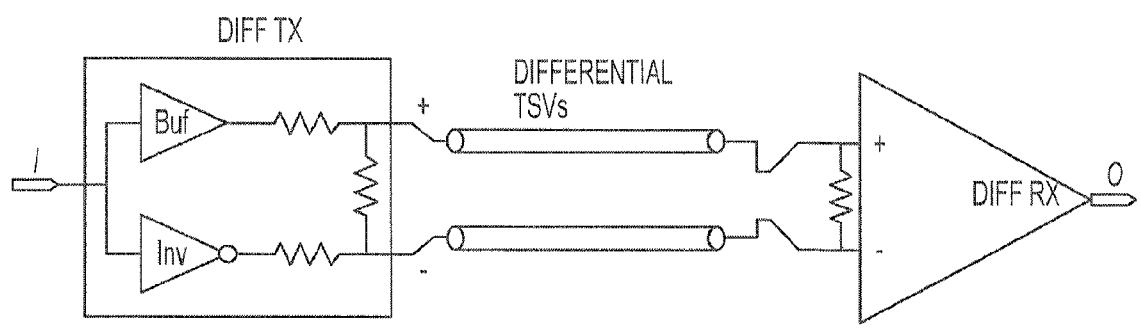
Figure 6F:
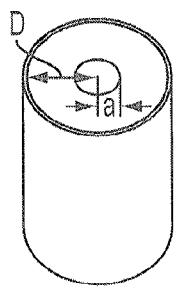

TSV structures that can be used in the subject reconfigurable TSV schemes include, but are not limited to, 1S TSVs, 1S2G TSVs, 1S4G TSVs, 1S8G TSVs, and other signal/ground TSV arrangements; differential TSV structures; and coaxial through-silicon line structures. FIGS. 6A-6F illustrate a few examples of TSV structures that can be used in the subject reconfigurable TSV schemes. FIG. 6A shows a 1S TSV, FIG. 6B shows a 1S2G TSV, FIG. 6C shows a 1S4G TSV, and FIG. 6D shows a 1S8G TSV. FIG. 6E shows a differential TSV structure, which uses transceiver (TX) and receiver (RX). The differential signals of the differential TSV structure consist of a pair of positive and negative signals. The positive signal of the differential signal pair is the original signal (i.e., S+=S), and the negative signal is the inverted signal. In addition, FIG. 6F shows an RF coaxial TSV. Table 2 shows the associated expected BW performance, number of single TSV constituents of each structure, and die area for each of the structures shown in FIGS. 6A-6F based on a 5 µm individual (1S) TSV diameter and a 10 µm center-to-center spacing between adjacent TSVs. It should be understood that these TSV structures are provided only as examples and other structures can be used with the subject reconfigurable TSV schemes.

TABLE 2

| Structure | BW | TSV | Area x = 100 µm² |
|---|---|---|---|
| 1S | 1 Gbps (low) | 1 | 1x |
| 1S2G | 4 Gbps | 2 | 2x |
| 1S4G | 8 Gbps (average) | 2-3 | 2x-3x |
| 1S8G | 9 Gbps | 4-5 | 4x-5x |
| Differential TSV | 10-40 Gbps | 2 | 2x + circuit area |
| RF Coaxial TSV | 84 Gbps | 2 | 2x |

According to one embodiment, conventional sized TSVs can be formed in an array for linking one core of a 3D IC to another core of the 3D IC. Each TSV of the array can have a dual or multi use, enabling multiple TSV structures to be provided from the same TSV array. For example, the TSVs of the array can be configured as 1S TSVs by each being linked to the relevant signal line.

Figure 7:
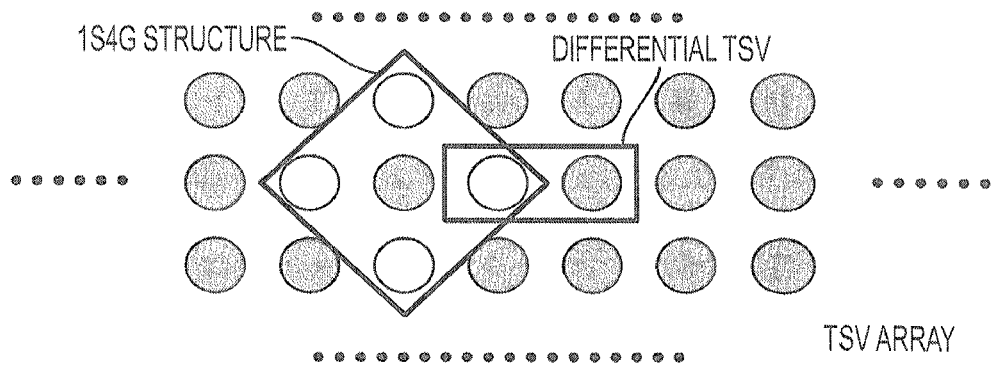
FIG. 7 shows a plan view of a TSV array for illustration of a switching scheme between a 1S4G and differential TSV in accordance with an embodiment of the reconfigurable 3D interconnect scheme of the present invention.

The same TSVs can be reconfigured as 1S2G, 1S4G, 1S8G, or other signal/ground arrangements by linking selected ones of the TSVs to ground instead of to the relevant signal line. Other configurations can be accomplished by linking one or more of the TSVs to additional circuitry. For example, one input signal can be converted to two differential input signals as shown in FIG. 6E. These two signals will be transmitted across a pair of TSVs, and their differential from the receiver circuit will be linked to the relevant signal line. A schematic example is shown in FIG. 7, which illustrates a 1S4G TSV structure created from an array of five 1S TSVs. The four outer TSVs are linked to ground. The signal is sent through the center TSV. Likewise, a differential TSV structure can be created from two of the TSVs in the array by sending a signal through both of the TSVs and linking the two TSVs to the appropriate transceiver circuitry (see FIG. 6E for the transceiver circuitry).

When allowing for reconfiguration to differential TSV structures, because only the differential TSV structure requires transceiver circuitry, the number of in-plane transceivers for a given tier in a 3D IC can be determined to satisfy a performance-based design threshold within the TSV array. For example, for a given 3D IC design 20% of communication TSVs can be fabricated with transceivers to enable sufficient maximum vertical BW performance. Note that this threshold can be increased or decreased depending on the needs of the 3D IC circuit design and the BW capacity of the vertical links.

In accordance with certain embodiments of the invention, the type and number of TSV structures can be optimized for the particular applications and circuitry on a 3D IC.

Advantageously, according to one aspect of the present invention, capacity can be established in real time on an as-needed basis.

According to one embodiment, the switching from one signal path to another signal path can be accomplished using routing circuitry. The routing circuitry can include pass transistors connected to each TSV. For chips having FPGAs, the existing FPGAs can be used to control the pass transistors. For example, a memory cell, such as an SRAM cell, can be connected at the gate of each pass transistor. The FPGA (or other device) can write a 0 or 1 to the memory cell in order to cause the TSV to be linked in a particular configuration.

Figure 8A:
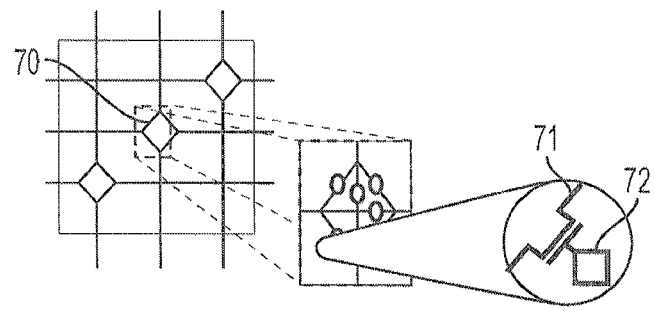
FIG. 8A shows a schematic diagram with explosive view of a TSV routing configuration for a 3D IC in accordance with an embodiment of the invention.

FIG. 8A shows a schematic diagram with explosive view of a TSV routing configuration for a 3D IC in accordance with an embodiment of the invention. Three TSVs (70) are shown in the plan view. Each TSV can include one or more pass transistors (71) for connecting the corresponding TSV (70) to a particular line. A memory cell (72) can be used to turn on and off the pass transistor (71) by storing a "1" or a "0".

Figure 8B:
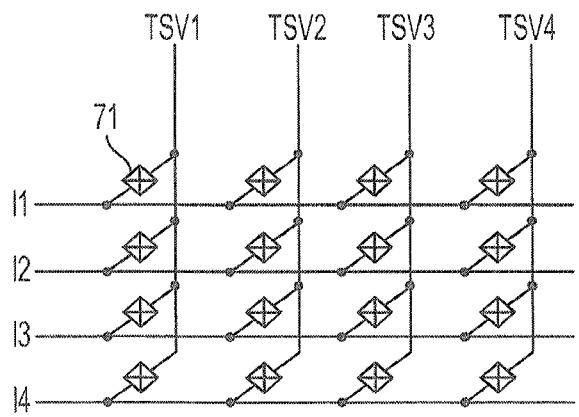
FIG. 8B shows a diagram of a reconfigurable TSV scheme in accordance with an embodiment of the invention.

For example, referring to FIG. 8B, four inputs (I1, I2, I3, I4) are provided that can be passed to one of the four TSVs (TSV1, TSV2, TSV3, TSV4) shown in the schematic via routing circuitry and one or more pass transistors (71).

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

Example

Figure 1A:
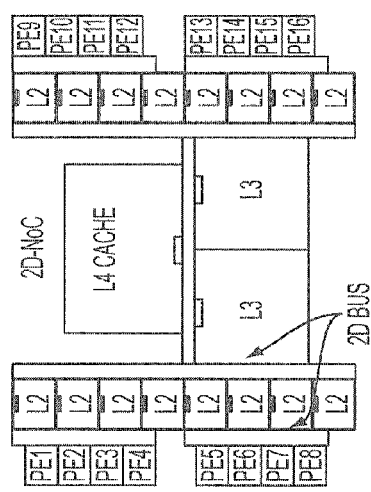
FIGS. 1A and 1B respectively show a 2D and a 3D implementation of a many-core IC.
Figure 1B:
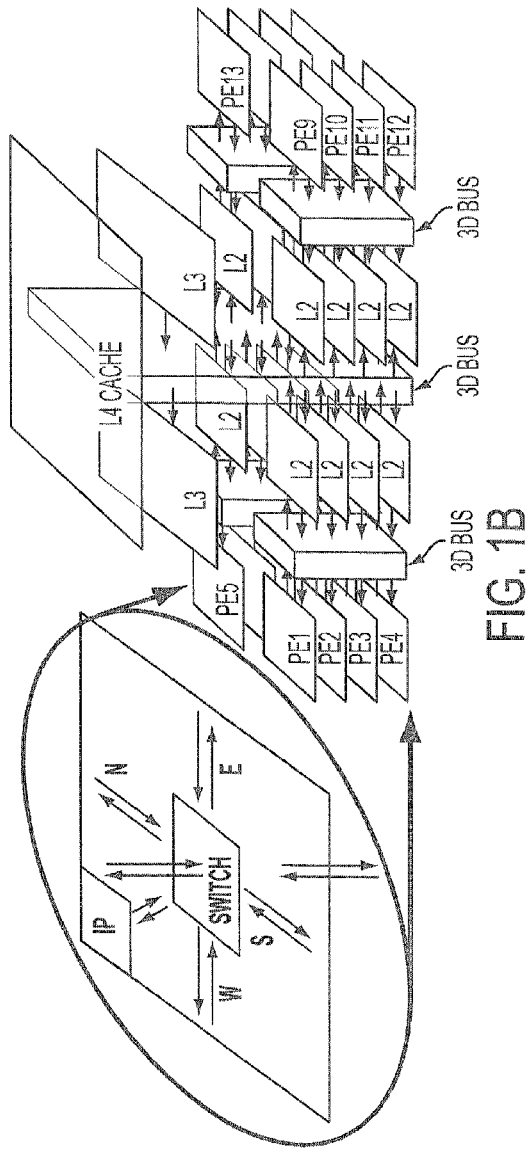
Figure 2:
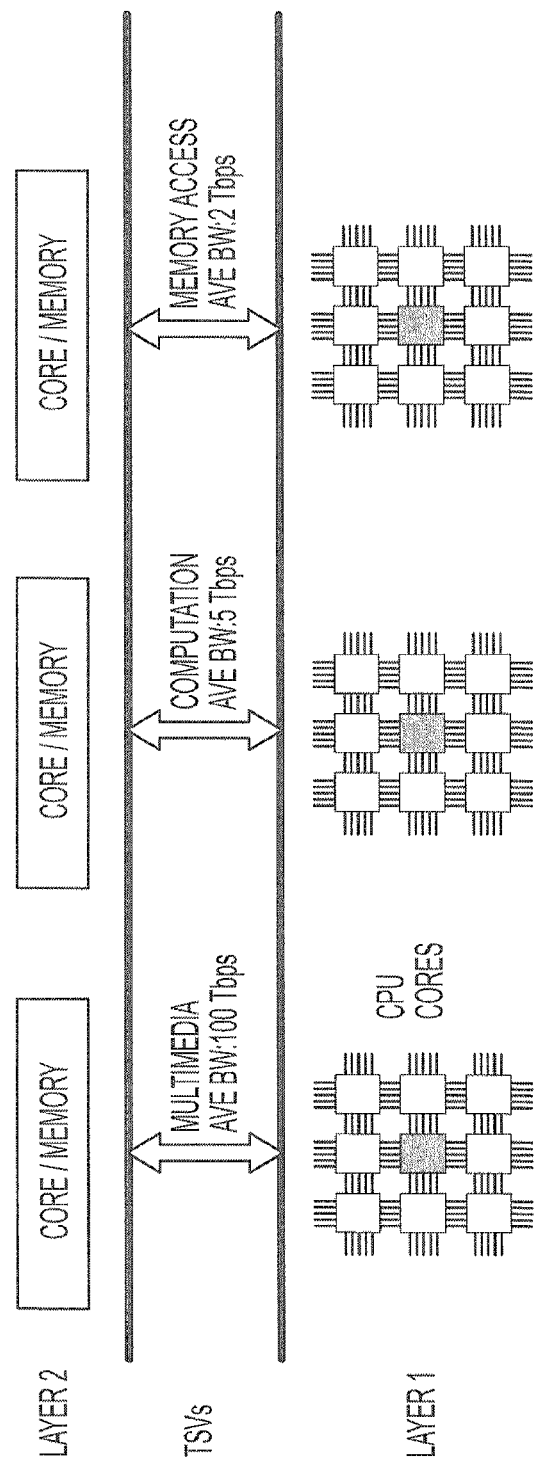
FIG. 2 shows a diagram indicating vertical BW according to 3D many-core IC application.
Figure 3:
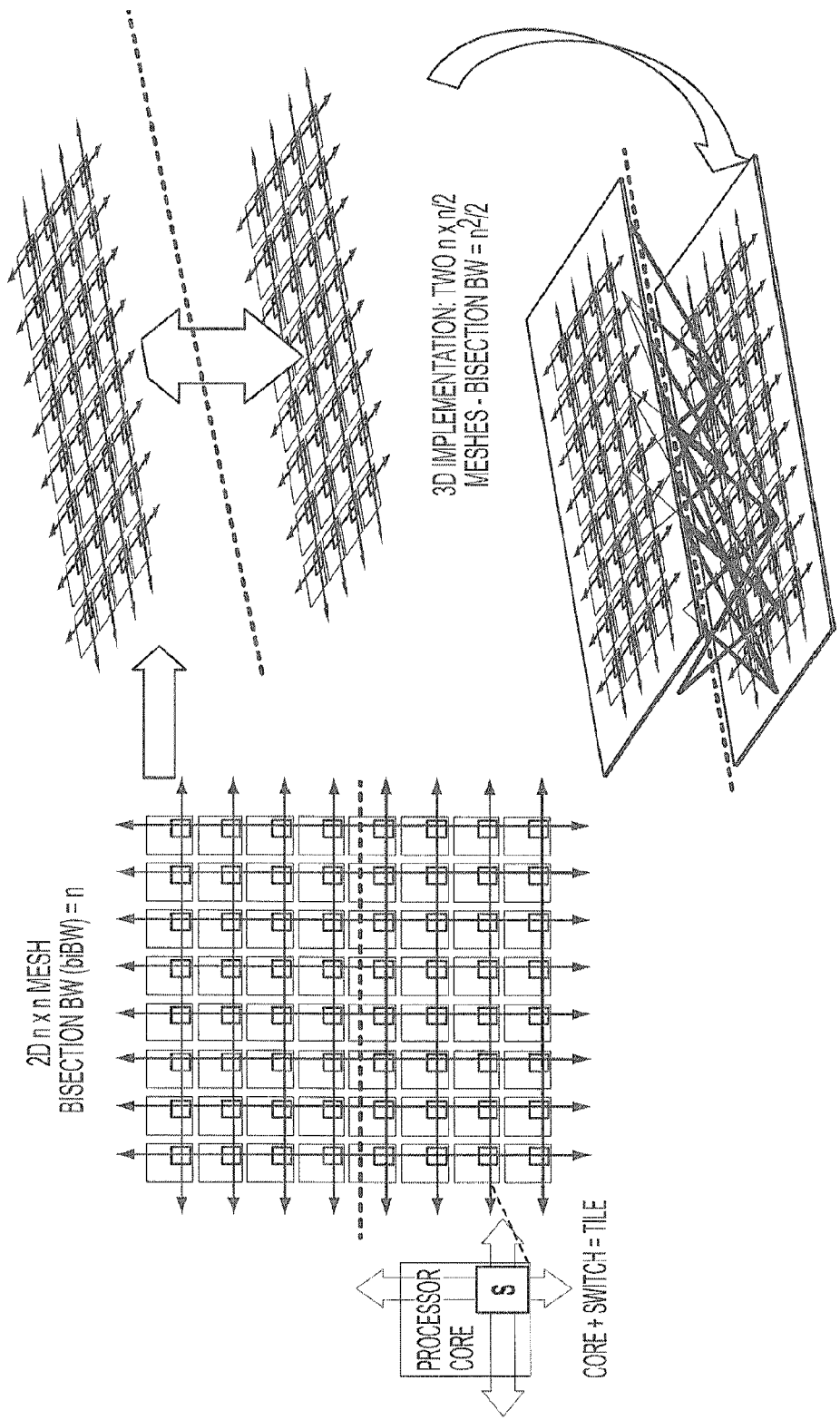
FIG. 3 shows a schematic representation illustrating the relationship between topology and BW of a many-core 3D IC.
Figure 4:
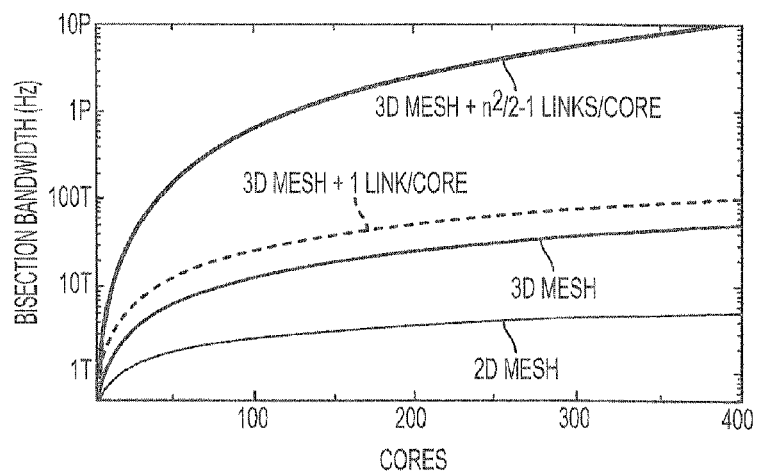
FIG. 4 shows a graph indicating bisection BW for topologies of 2D, 3D and 3D-enhanced systems as a function of the number of cores.
Figure 5:
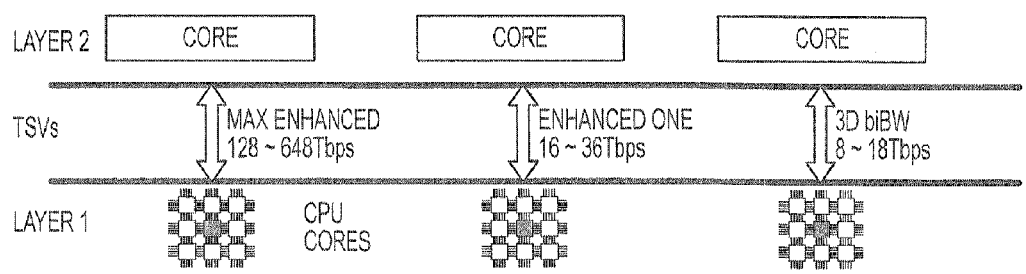
FIG. 5 shows a diagram indicating vertical BW according to 3D many-core IC topology.
Figure 9:
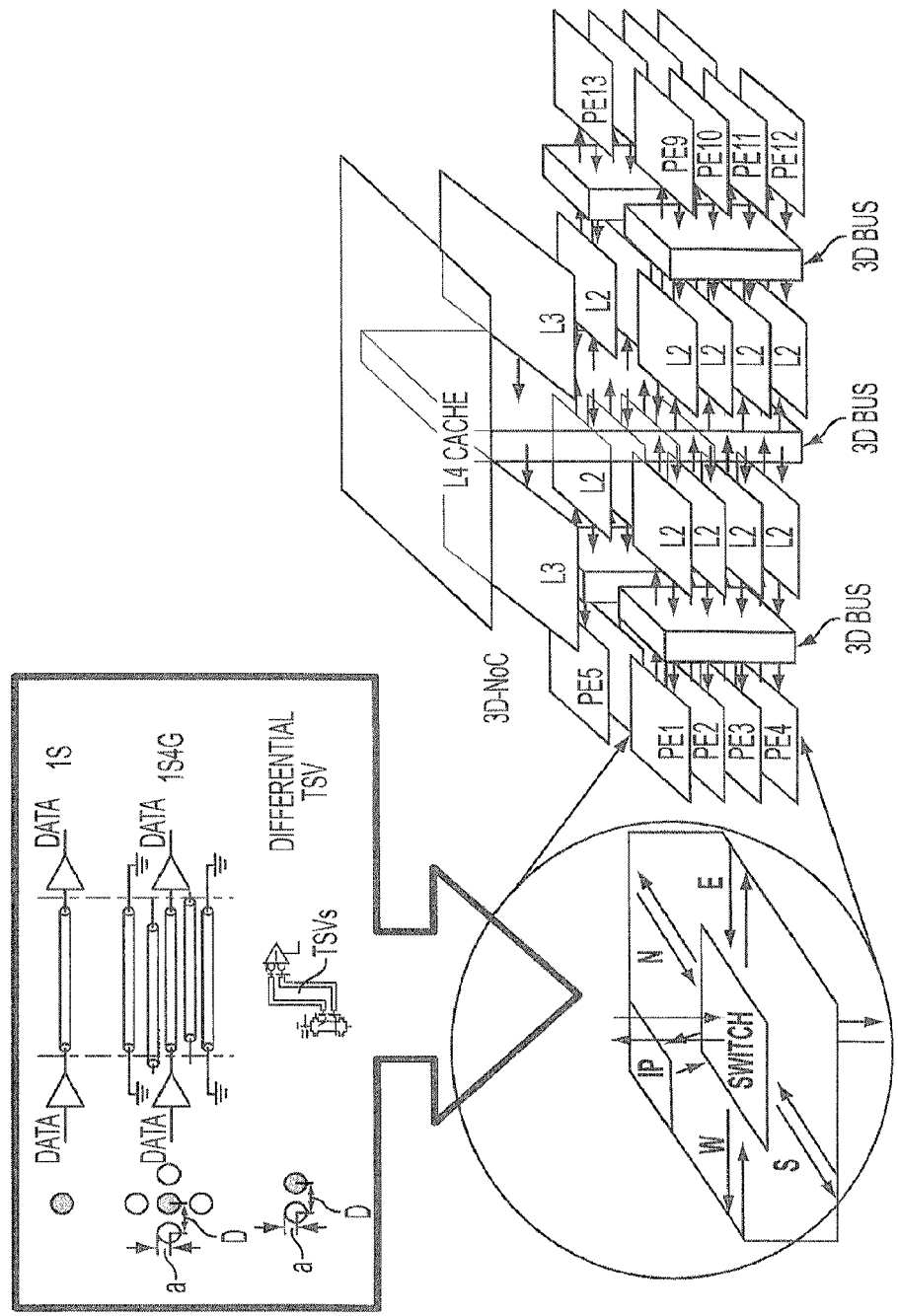
FIG. 9 illustrates an example implementation in the 3D NoC of FIG. 1B of a reconfigurable 3D interconnect scheme according to an embodiment of the present invention.

FIG. 9 illustrates an implementation of a reconfigurable 3D interconnect based on the 1S, 1S4G, and differential TSVs. It should be understood that the selection of three types of TSV structures is for illustrative purposes only and that more or less types of TSV structures can be utilized and reconfigured in a single 3D IC. Referring to FIG. 9, the 3D IC can be the 3D NoC shown in FIG. 1B, which includes multiple tiers of PEs and various higher cache levels (L2, L3, and L4) connected by busses. To move between levels, a 3D link switch element is used for movement N, S, E, W, up, and down. The vertical (up and down) links correspond to a TSV structure. Here, the vertical links can be one of the three TSV structures (1S, 1S4G, or differential TSV). The drive circuitries of the 1S and 1S4G TSVs and the transceiver circuitry of the differential TSV are shown in the box in FIG. 9.

As noted above, the reconfigurable TSV scheme described herein is suitable for use with a wide range of TSV structures used for the vertical links and should not be construed as limited to the structures described with respect to the examples herein.

In accordance with an embodiment of the present invention, an array of individual TSVs (i.e. 1S TSV elements), such as shown in FIG. 7, can be dynamically reconfigured into 1S4G TSVs or differential TSVs (and vice versa) via conventional in-plane wiring, and buffer, and transceiver circuitry that are activated as part of a conventional NoC architecture. Thus, based on the signal routing between tiers in a 3D IC, a given individual TSV of the array element can operate as a 1S TSV structure, as one constituent in a 1S4G TSV structure, or as one constituent in a differential TSV structure. The wiring, buffer and/or transceiver circuitry required for TSV reconfiguration requires negligible area compared with the TSVs themselves and does not meaningfully contribute to the effective area used by a particular TSV structure.

Figure 10A:
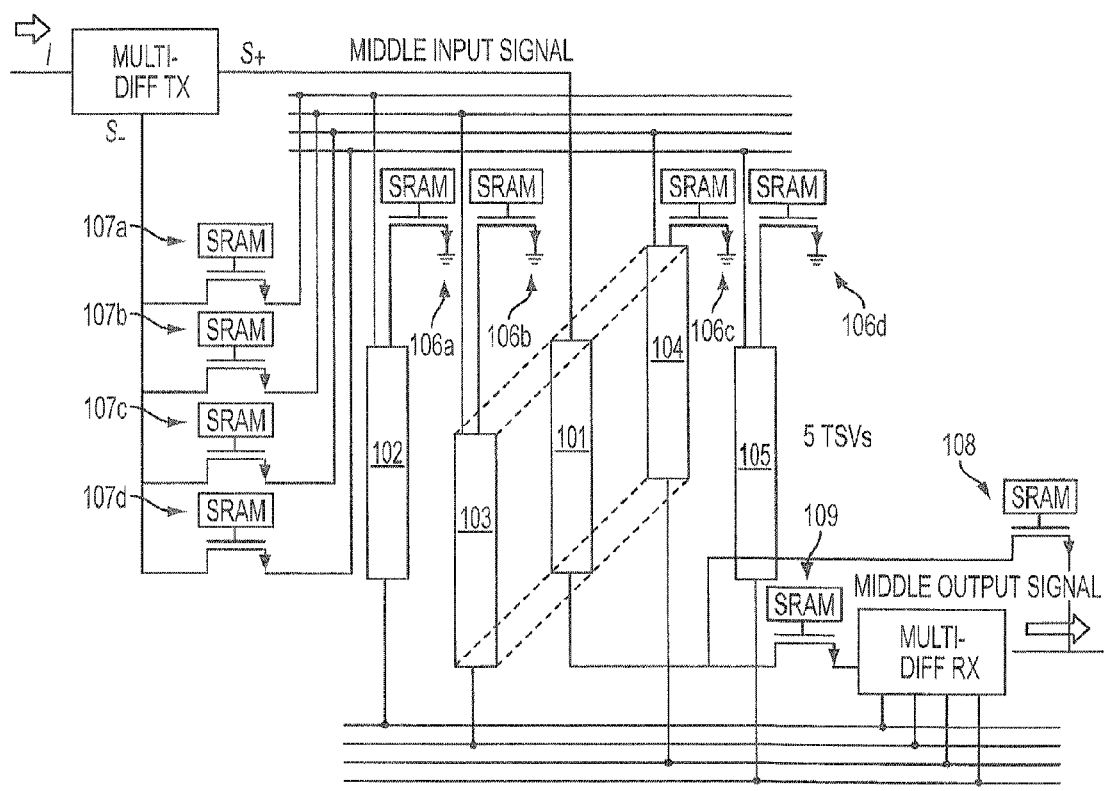
FIG. 10A shows a schematic of circuitry for reconfiguration between 1S4G and differential TSV structures in accordance with an embodiment of the present invention.
Figure 10B:
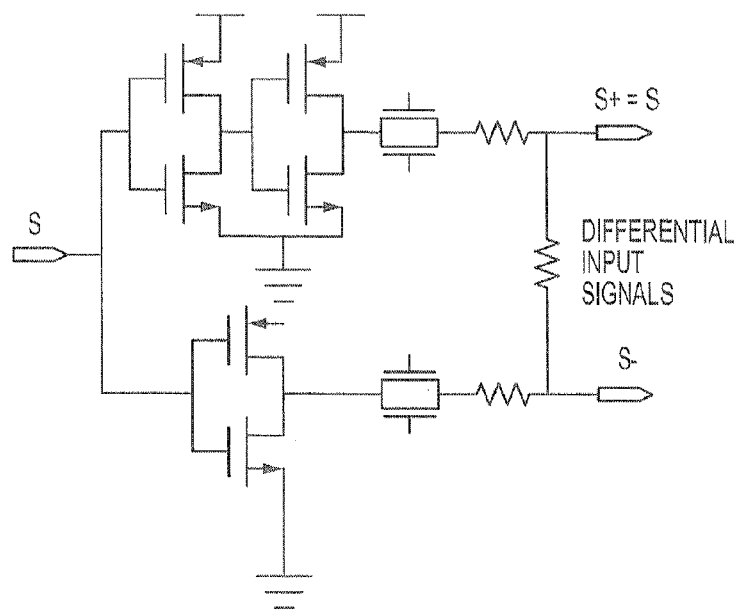
FIGS. 10B and 10C illustrate detailed transceiver (TX) and receiver (RX) circuits, respectively, for differential TSV structures that may be used in accordance with certain embodiments of the present invention.
Figure 10C:
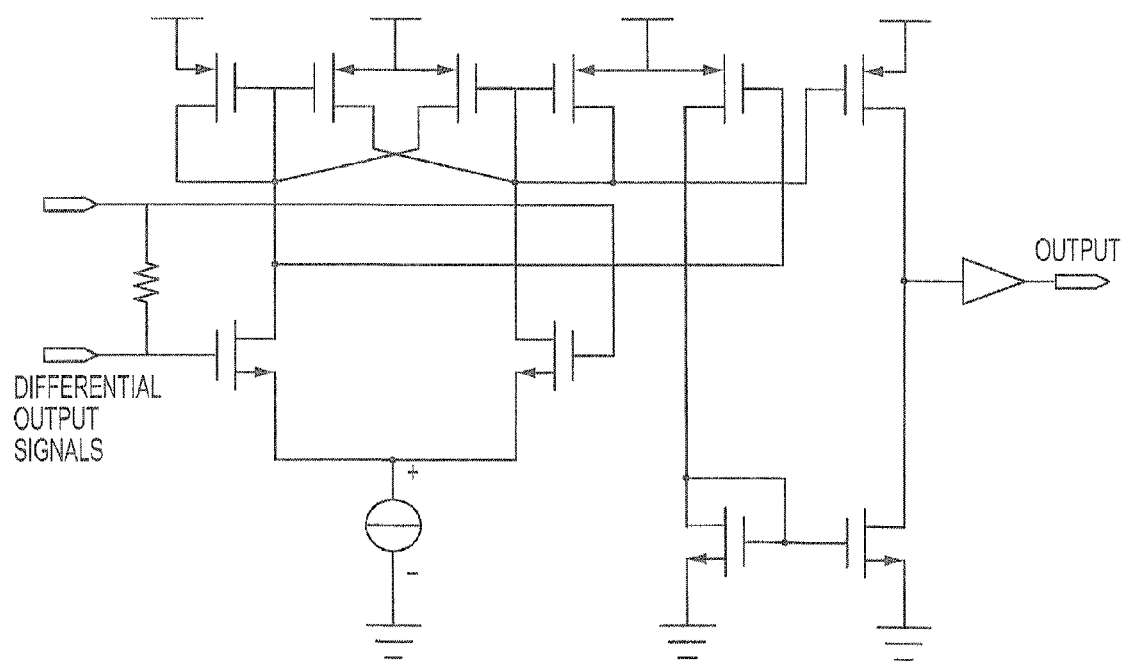

FIGS. 10A, 10B and 10C provide detailed schematic diagrams illustrating one embodiment of reconfiguration circuitry between the 1S4G and differential TSV structures. It should be understood that the reconfigurability is applicable to any TSV structure having signal and ground conductors (e.g. coaxial).

Referring to FIG. 10A, which shows 5 TSVs, the middle TSV 101 is connected to the middle signal S through a multi-differential transceiver (TX) circuit. One embodiment of this circuit is illustrated in FIG. 10B. As shown in FIG. 10B, the circuit generates the differential pair based on the signal S. S+ is the original S, while S− is the inverted version of S. Thus, the middle TSV 101 is always (when connected in this manner) transmitting the original signal or the positive signal of the differential pair.

Each of the four surrounding TSVs (102, 103, 104, 105) is connected to two parallel pass transistors: one pass transistor (106a, 106b, 106c, 106d) is linked to ground; the other one (107a, 107b, 107c, 107d) is linked to the negative signal of the differential pair. Accordingly, by turning on the first or the second pass transistors, the TSV can be reconfigured from a ground TSV to the differential signal TSV or vice versa. As a result, a given set of TSVs can be reconfigured between 1S4G and differential TSV structures. The selection of ON or OFF of the pass transistor is achieved by programming the SRAM cell of the specific pass transistor to "0" and "1". Accordingly, the negative signal (S−) can be allocated in one of the four surrounding TSVs (102, 103, 104, 105).

The output of the 1S4G is simply the output through one pass transistor 108 at the receiver (RX) side. The output of the middle TSV is also through another pass transistor 109 and linked to the multi-differential receiver (RX) circuit. The RX circuit is illustrated in FIG. 10C. The RX circuit uses this signal from the middle TSV and the corresponding negative signal from the differential TSV, converting the two differential signals into the output signal.

The above description illustrates the reconfiguration of 1S4G and differential TSV transmission and the corresponding circuitries. If a 1S TSV is also required along with 1S4G and differential cases, additional pass transistors will be needed for each of four surrounding TSVs for the transceiver and receiver sides, resulting in a total of 8 additional pass transistors in this example.

According to one embodiment using the 1S, 1S4G and differential TSV reconfigurable TSVs, a method of reconfiguration can be accomplished as follows:

1S→1S4G: Turn ON four pass transistors to ground for the four TSVs denoted by white circles in FIG. 7 and turn OFF the four pass transistors to signal lines.

1S4G→1S: Turn OFF four pass transistors to ground for the four TSVs denoted by white circles in FIG. 7 and turn ON the four pass transistors to signal lines.

1S→differential TSV: Activate transceiver circuitry (both pass transistors to signal lines remain ON; both pass transistors to ground remain OFF).

differential TSV→1S: Deactivate transceiver circuitry (both pass transistors to signal lines remain ON; both pass transistors to ground remain OFF).

1S4G→differential TSV: For ground TSVs in FIG. 10A turn OFF pass transistor to ground, turn ON pass transistor to differential line. Activate multi-differential transceiver circuitry. Note that the output pass transistor of the multi-differential receiver circuitry is turned ON as well as the pass transistor for the negative output. Thus, the multi-differential receiver circuitry will generate the output signal from the different output pairs.

differential TSV→1S4G: Turn ON (OFF) the pass transistor to ground (signal) for one of the TSVs in the differential pair as shown in FIG. 10A. Configure the remaining 3 TSVs to complete the 1S4G TSV structure.

A similar scheme can be used to apply other 1SnG TSV structures such as the 1S8G TSV structure. In addition, embodiments of the subject reconfiguration scheme are suitable to other TSV structures such as coaxial TSVs.

The subject reconfigurable schemes can be applied in a monomorphic or polymorphic manner. That is, in certain embodiments using monomorphic schemes, the TSV structures can be configured such that structures of only a single type are used at any given time. In certain embodiments using polymorphic schemes, the TSV structures can be configured such that multiple structures are available at any given time to deal with aggregate vertical link demands.

Example

Performance Optimization Characterization

Simulations were performed to illustrate 3D IC performance optimization using reconfigurable TSV structures in accordance with an embodiment of the invention.

Case 1 illustrates performance of a monomorphic TSV configuration, where all TSV structures are of one type, and Case 2 illustrates performance of a polymorphic TSV configuration in accordance with embodiments of the invention.

Case 1: Monomorphic TSV Configuration (all TSV Structures of One Type).

Consider a 3D IC system that demands a certain vertical BW per link dependent on the mode of 3D IC operation. Each mode can be addressed by a monomorphic vertical link design where all TSVs are of the same structure (i.e. all TSVs are of the 1S type, or all TSVs are of the 1S4G type, etc.).

Figure 11A:
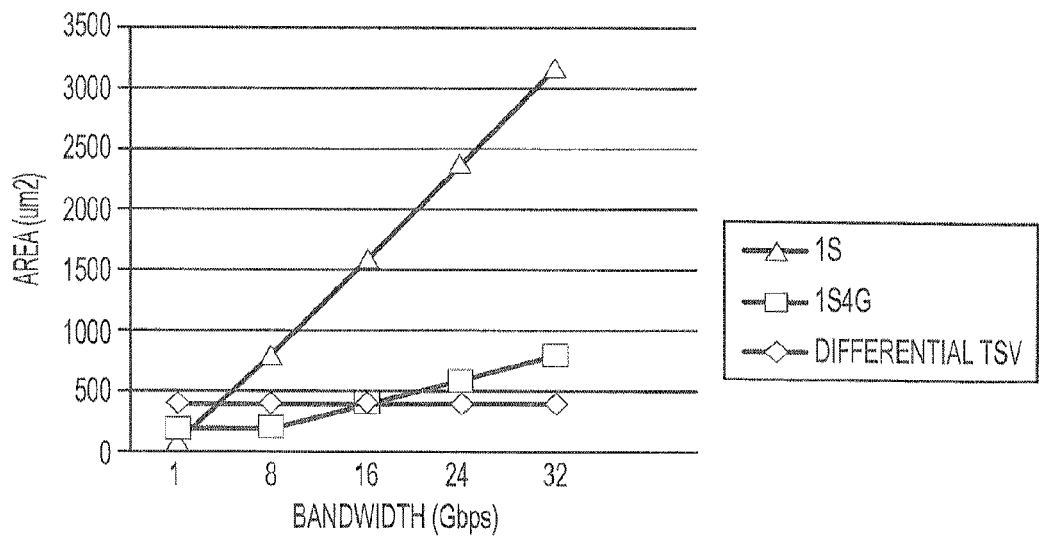
FIGS. 11A and 11B show plots providing a comparison between 1S, 1S4G, and differential TSV structures with respect to BW, area, and power.
Figure 11B:
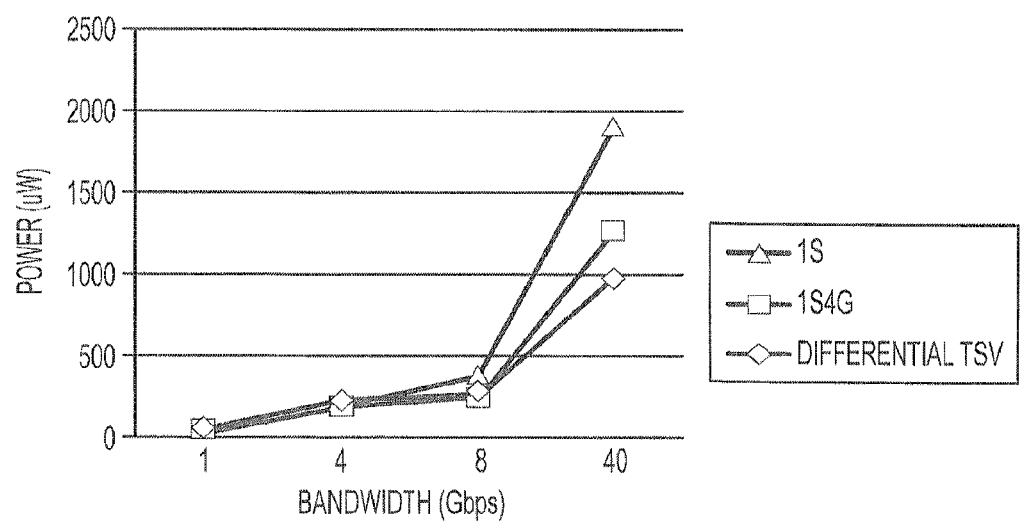

FIGS. 11A and 11B respectively plot the BW versus area and BW versus power characteristics for the three TSV structures considered. FIGS. 11A and 11B provide a relative comparison between these TSV structures as to their suitability for the 3D interconnect needs for a given system. Here, the power usage of a given TSV structure is represented by $P=CV^2f$, where P is the power usage/TSV, C is the capacitance/TSV, V is the voltage applied across the TSV, and f is the signal frequency. The power usage for the 1S4G TSV structure includes the signal TSV elements and buffers. The power usage for the differential TSV structure includes the differential TSV elements and transceiver circuitry.

Referring to FIG. 11A, with respect to area efficiency, low BW operation (<2 Gbps/link) is optimized through the use of 1S TSVs and average or mid-range BW operation (2-16 Gbps/link) is optimized by the use of 1S4G TSVs. Although the area/TSV structure is larger for the 1S4G TSVs as compared to the 1S TSVs, fewer 1S4G structures are required to meet the BW requirement. For high BW operation (>16 Gbps/link), area efficiency is optimized by a differential TSV structure, which outperforms 1S4G TSVs at higher frequencies.

Referring to FIG. 11B, in terms of power efficiency, low BW operation (<1 Gbps/link) power consumption is optimized through the use of 1S TSVs, average or mid-range BW operation (1-8 Gbps/link) power consumption is optimized by the use 1S4G TSVs, and high BW operation (>8 Gbps/link) power consumption is optimized by the use of a differential TSV structure.

Embodiments of the subject reconfigurable TSV technology can dynamically reconfigure the 3D IC vertical links to optimize the vertical interconnect performance depending on the mode of operation and the corresponding BW requirement per link.

Therefore, for a 3D IC system incorporating a monomorphic vertical link design for which communication BW requirements change during operation, the subject reconfigurable 3D interconnect can utilize particular TSV structures for an optimal mode of operation. For 3D IC modes requiring vertical BW less than or equal to 1 Gbps/link, the vertical links can be configured as 1S TSV structures to simultaneously optimize power consumption and area. For 3D IC modes requiring vertical BW of about 1-8 Gbps/link, the vertical links can be configured as 1S4G TSV structures to simultaneously optimize power consumption and area. For 3D IC modes requiring vertical BW greater than 8 Gbps/link, the vertical links can be configured as differential TSV structures to simultaneously optimize power consumption and area.

Case 2: Polymorphic TSVs (Mixed TSV Structures).

Consider a 3D IC system that demands a certain aggregate vertical BW, but which requires a range of vertical BW per link dependent on the mode of 3D IC operation. This would be optimized by a polymorphic vertical link design wherein a variety of TSV structures are present (i.e. a given fraction are of the 1S type, a given fraction are of the 1S4G type, etc. . . . ). The subject reconfigurable TSV technology can be used to dynamically reconfigure the 3D IC vertical links to optimize the vertical interconnect performance depending on the mode of operation and the variable BW requirement per link.

Example

Reconfigurable TSV Performance Comparison for Aggregate BW Needs

Figure 12A:
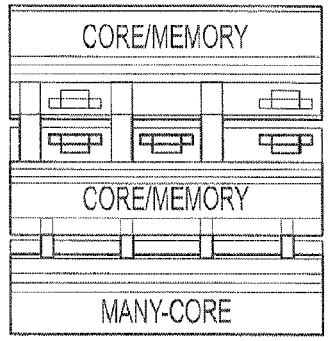
FIGS. 12A and 12B provide a representation of a 3D IC having a many-core layer, and core/memory layers (FIG. 12A) and a diagram indicating vertical BW according to layer connection (FIG. 12B) for explaining an example optimization of power and area using the reconfigurable 3D interconnect TSV technology of an embodiment of the present invention.
Figure 12B:
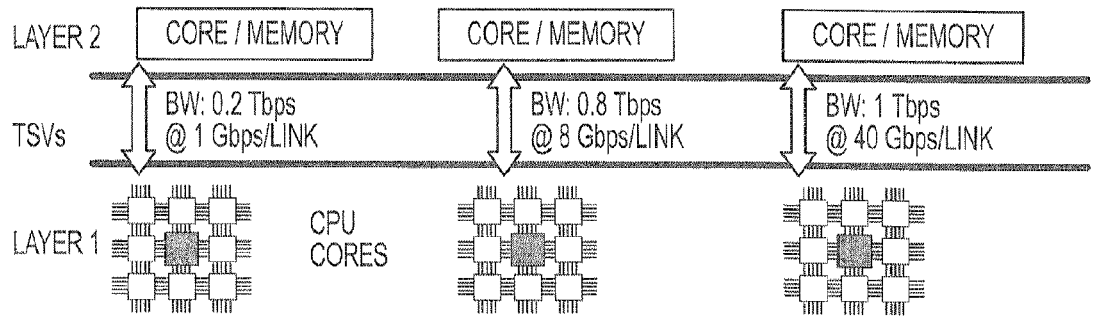

FIGS. 12A and 12B show a 3D IC and corresponding bandwidth needs used to illustrate TSV performance. As an example shown in FIGS. 12A and 12B, consider a many-core 3D IC system for which the dynamic aggregate BW is 2 Tbps at any given moment and includes 3 sub-bands with distinct BW/TSV requirements:

(1) A 0.2 Tbps aggregate BW characterized by a peak BW/TSV of 1 Gbps;

(2) A 0.8 Tbps aggregate BW characterized by a peak BW/TSV of 8 Gbps; and (3) A 1 Tbps aggregate BW characterized by a peak BW/TSV of 40 Gbps.

The reconfigurable TSV technology can be used to optimize the system by satisfying the peak BW/TSV needs while minimizing power/TSV and area/TSV. For example, the low BW (peak of 1 Gbps/TSV) mode can be optimized using 1S TSVs, where each 1S TSV can average 1 Gbps. To achieve the 0.2 Tbps aggregate BW of this example, 200 1S TSV structures are used (0.2 Tbps×1000 Gbps per Tbps/1 Gbps per TSV=200 TSV). The midrange BW (peak of 8 Gbps/TSV) mode can be optimized using 1S4G TSVs where each 1S4G TSV structure can average 8 Gbps. To achieve the 0.8 Tbps aggregate BW of this example, 100 1S4G TSV structures are used (0.8 Tbps×1.000 Gbps per Tbps/8 Gbps per TSV=100 TSV). In addition, the high BW (peak of 40 Gbps/TSV) mode can be optimized using differential TSVs, where each differential TSV structure can average 40 Gbps. To achieve the 1 Tbps aggregate BW of this example, 25 differential TSV structures are used (1 Tbps×1000 Gbps per Tbps/40 Gbps per TSV=25 TSV).

The example described in FIG. 12B is simulated using the above described polymorphic TSV configuration and three monomorphic TSV configurations. Table 3 provides the details of the simulated scenarios.

TABLE 3

| Scenario | TSVs | | Total number of TSVs | Power (mW) | | Area (mm²) | |
|---|---|---|---|---|---|---|---|
| Scenario 1 | 1S | 200 | 325 | 9.6 | 37.5 | 0.02 | 0.07 |
| | 1S4G | 100 | | 25.6 | | 0.04 | |
| | Diff TSV | 25 | | 2.3 | | 0.01 | |
| Scenario 2 | All 1S | | 2000 | 96 | | 0.2 | |
| Scenario 3 | All 1S4G | | 425 | 195.2 | | 0.205 | |
| Scenario 4 | All Diff TSV | | 325 | 40.8 | | 0.13 | |

Figure 13:
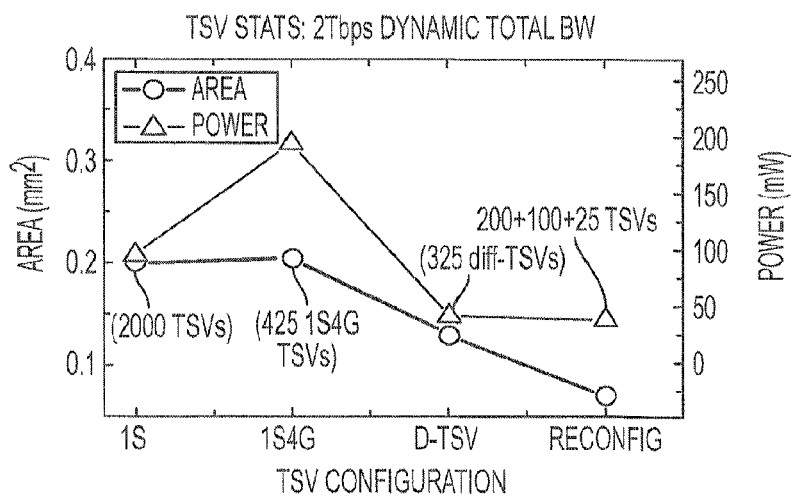
FIG. 13 shows a plot providing a comparison of BW, area, and power between monomorphic TSV configurations of 1S, 1S4G, and differential TSV structures and a polymorphic TSV arrangement in accordance with an embodiment of the present invention.

FIG. 13 graphically illustrates the optimization capabilities of using the subject reconfigurable polymorphic scheme as compared to the monomorphic schemes using the scenarios provided in Table 3. Referring to FIG. 13, the four schemes are shown labeled on the horizontal axis. The first three schemes are monomorphic and the fourth scheme is polymorphic. In particular, scheme "1S" is comprised of 2000 1S TSVs; scheme "1S4G" is comprised of 425 1S4G TSVs; scheme "D-TSV" is comprised of 325 differential TSVs; and scheme "Reconfig" is comprised of 200 1S TSVs+100 1S4G TSVs+25 differential TSVs. The plot indicated with filled circles shows the TSV area overhead (left vertical axis) for the four different schemes. It is clear from the plot that the reconfigurable scheme requires the smallest area. The plot indicated with filled triangles shows power consumption for the four different schemes (right vertical axis). Compared with the three monomorphic schemes, the reconfigurable polymorphic scheme has the lowest power consumption.

Accordingly, as the 3D IC operation mode varies and the aggregate BW changes (or the distinct BW/TSV requirements change over time) the reconfigurable TSV technology can be used to maintain an optimal distribution of 1S, 1S4G, and differential TSVs to optimize power and area utilization.

Example

RF and Digital Signal Capabilities

Figure 14A:
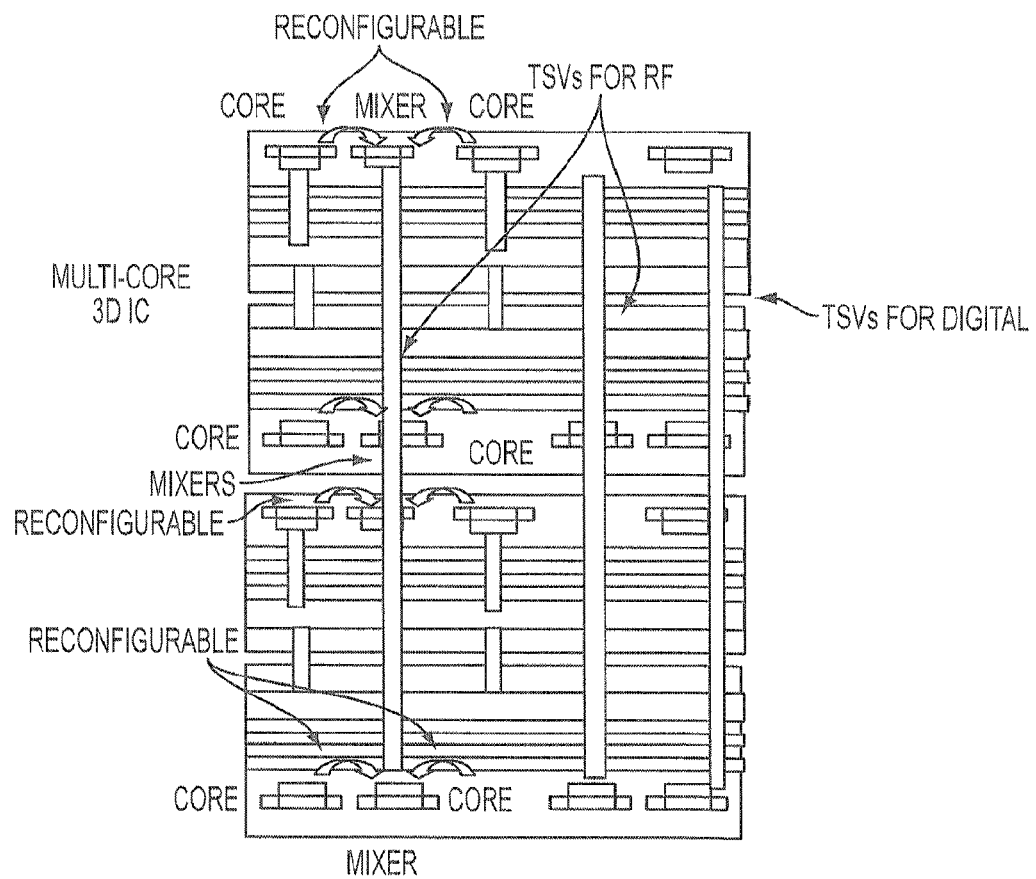
FIGS. 14A and 14B show representations of a 3D IC with RE and reconfigurable TSV structure in accordance with an embodiment of the present invention.
Figure 14B:
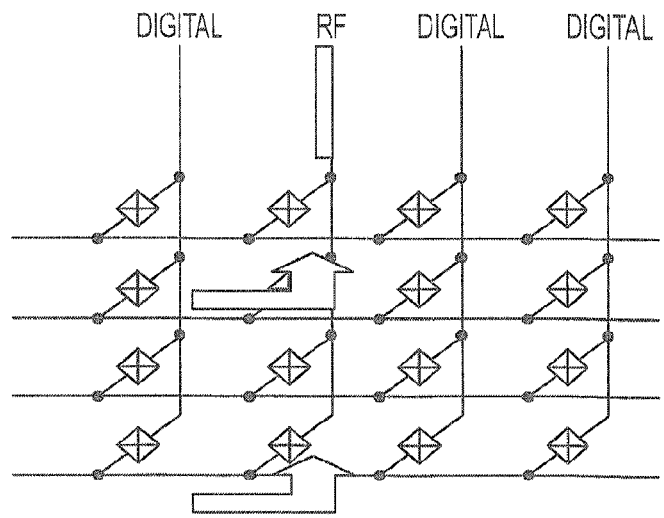

FIGS. 14A and 14B show representations of a 3D IC with RF and digital reconfigurable TSV structure in accordance with an embodiment of the present invention. FIG. 14A shows a side-sectional view and FIG. 14B shows a schematic diagram.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. A reconfigurable 3D interconnect, comprising:
an array of vertical interconnect vias; and
a routing circuit connected to each vertical interconnect via of the array of vertical interconnect vias, an input/output node of a first core element, and an input/output node of a second core element stacked above the first core element to allow re-routing of a signal through the array of vertical interconnect vias during operation,
wherein the routing circuit is configured to selectively connect each vertical interconnect via of the array of vertical interconnect vias from a ground line, voltage line, or floating line to a signal path between the input/output node of the first core element and the input/output node of the second core element and vice versa in a plurality of configurations during operation for routing a signal between the input/output node of the first core element and the input/output node of the second core element,
wherein the plurality of configurations include a first configuration comprising a plurality of the vertical interconnect vias selectively connected for routing the signal between the input/output node of the first core element and the input/output node of the second core element, a second configuration comprising more of the vertical interconnect vias than the first configuration, and a third configuration comprising less or different ones of the vertical interconnect vias than the first configuration.

2. The reconfigurable 3D interconnect according to claim 1, wherein, for the first configuration, at least one of the plurality of the vertical interconnect vias is connected at one end to the ground line and at least one of the plurality of the vertical interconnect vias is connected at one end to the input/output node of the first core element.

3. The reconfigurable 3D interconnect according to claim 1, wherein the routing circuit is configured to create 1S TSV structures from the array of vertical interconnect vias for bandwidth requirements of less than 2 Gbps/link, wherein in response to an indication that the signal between the input/output of the first element and the input/output of the second element has a bandwidth requirement of less than 2 Gbps/link, the routing circuit connects the array of vertical interconnect vias such that a 1S TSV configuration is connected on the signal path.

4. The reconfigurable 3D interconnect according to claim 1, wherein the routing circuit is configured to create 1 SnG TSV structures from the array of vertical interconnect vias for bandwidth requirements of between 2 and 16 Gbps/link, wherein in response to an indication that the signal between the input/output of the first element and the input/output of the second element has a bandwidth requirement of between 2 and 16 Gbps/link, the routing circuit connects the array of vertical interconnect vias such that a 1SnG TSV configuration is connected on the signal path.

5. The reconfigurable 3D interconnect according to claim 1, wherein the array of vertical interconnect vias comprises single through silicon vias (TSVs).

6. The reconfigurable 3D interconnect according to claim 5, wherein the routing circuit is configured to form a monomorphic configuration of TSV structures from the array of vertical interconnect vias.

7. The reconfigurable 3D interconnect according to claim 5, wherein the routing circuit is configured to form a polymorphic configuration of TSV structures from the array of vertical interconnect vias.

8. The reconfigurable 3D interconnect according to claim 1, further comprising a transceiver circuit, wherein the routing circuit is further configured to connect each vertical interconnect via to the transceiver circuit to create differential TSV structures during a certain mode of operation.

9. The reconfigurable 3D interconnect according to claim 8, wherein the routing circuit is configured to create differential TSV structures from the array of vertical interconnect vias for bandwidth requirements of between 16 and 40 Gbps/link, wherein in response to an indication that the signal between the input/output of the first element and the input/output of the second element has a bandwidth requirement of between 16 and 40 Gbps/link, the routing circuit connects the array of vertical interconnect vias such that a differential TSV configuration is connected on the signal path.

10. The reconfigurable 3D interconnect according to claim 1, wherein the array of vertical interconnect vias comprises coaxial TSVs.

11. The reconfigurable 3D interconnect according to claim 1, wherein the routing circuit comprises pass transistors.

12. The reconfigurable 3D interconnect according to claim 11, wherein the routing circuit further comprises a memory cell connected at a gate of each of the pass transistors, wherein the routing circuit writes a "0" or "1" to the memory cell to control the pass transistors.

13. The reconfigurable 3D interconnect according to claim 12, wherein the routing circuit uses an existing FPGA circuit on the substrate to control the pass transistors.

14. A reconfigurable 3D interconnect, comprising:
an array of vertical interconnect vias; and
a routing circuit connected to each vertical interconnect via of the array of vertical interconnect vias, an input/output node of a first core element, and an input/output node of a second core element stacked above the first core element to allow re-routing of a signal through the array of vertical interconnect vias during operation,
wherein the routing circuit is configured to selectively connect each vertical interconnect via of the array of vertical interconnect vias from a ground line, voltage line, or floating line to a signal path between the input/output node of the first core element and the input/output node of the second core element and vice versa in a plurality of configurations during operation for routing a signal between the input/output node of the first core element and the input/output node of the second core element,
wherein the routing circuit creates 1S TSV structures from the array of vertical interconnect vias for bandwidth requirements of less than 2 Gbps/link and creates 1 SnG TSV structures from the array of vertical interconnect vias for bandwidth requirements of between 2 and 16 Gbps/link, wherein:
in response to an indication that the signal between the input/output of the first element and the input/output of the second element has a bandwidth requirement of less than 2 Gbps/link, the routing circuit connects the array of vertical interconnect vias such that a 1S TSV configuration is connected on the signal path; and
in response to an indication that the signal between the input/output of the first element and the input/output of the second element has a bandwidth requirement of between 2 and 16 Gbps/link, the routing circuit connects the array of vertical interconnect vias such that a 1 SnG TSV configuration is connected on the signal path.

15. The reconfigurable 3D interconnect according to claim 14, further comprising a transceiver circuit, wherein the routing circuit connects each vertical interconnect via to the transceiver circuit to create differential TSV structures during a certain mode of operation.

16. The reconfigurable 3D interconnect according to claim 15, wherein the routing circuit creates the differential TSV structures from the array of vertical interconnect vias for bandwidth requirements of between 16 and 40 Gbps/link, wherein:
in response to an indication that the signal between the input/output of the first element and the input/output of the second element has a bandwidth requirement of between 16 and 40 Gbps/link, the routing circuit connects the array of vertical interconnect vias such that a differential TSV configuration is connected on the signal path.

17. A 3D integrated circuit (IC) comprising:
a first core element;
a second core element stacked above the first core element; and
a reconfigurable 3D interconnect connecting an input/output node of the first core element to an input/output node of the second core element, the reconfigurable 3D interconnect comprising:
an array of vertical interconnect vias; and
a routing circuit connected to each vertical interconnect via of the array of vertical interconnect vias, the input/output node of the first core element, and the input/output node of the second core element, wherein the routing circuit rewires the vertical interconnects of the array of vertical interconnect vias to modify the capacity between the input/output node of the first core element and the input/output node of the second core element during operation of the 3D IC,
wherein the routing circuit creates 1S TSV structures from the array of vertical interconnect vias for bandwidth requirements of less than 2 Gbps/link and creates 1SnG TSV structures from the array of vertical interconnect vias for bandwidth requirements of between 2 and 16 Gbps/link, wherein:
in response to an indication that the signal between the input/output of the first element and the input/output of the second element has a bandwidth requirement of less than 2 Gbps/link, the routing circuit connects the array of vertical interconnect vias such that a 1S TSV configuration is connected on the signal path; and
in response to an indication that the signal between the input/output of the first element and the input/output of the second element has a bandwidth requirement of between 2 and 16 Gbps/link, the routing circuit connects the array of vertical interconnect vias such that a 1 SnG TSV configuration is connected on the signal path.

18. The 3D IC according to claim 17, further comprising a transceiver circuit, wherein the routing circuit connects each vertical interconnect via to the transceiver circuit to create differential TSV structures during a certain mode of operation.

19. The 3D IC according to claim 18, wherein the routing circuit creates the differential TSV structures from the array of vertical interconnect vias for bandwidth requirements of between 16 and 40 Gbps/link, wherein:
in response to an indication that the signal between the input/output of the first element and the input/output of the second element has a bandwidth requirement of between 16 and 40 Gbps/link, the routing circuit connects the array of vertical interconnect vias such that a differential TSV configuration is connected on the signal path.

* * * * *

UNITED STATES PATENT AND TRADEMARK OFFICE
CERTIFICATE OF CORRECTION

PATENT NO. : 8,916,910 B2
APPLICATION NO. : 12/966128
DATED : December 23, 2014
INVENTOR(S) : Robert E. Geer et al.

It is certified that error appears in the above-identified patent and that said Letters Patent is hereby corrected as shown below:

IN THE SPECIFICATION

• Column 10, Line 42, "0.8 Tbps ×1.000 Gbps" should read "0.8 Tbps ×1000 Gbps".

Signed and Sealed this
First Day of December, 2015

Michelle K. Lee
*Director of the United States Patent and Trademark Office*